United States Patent
Chidambaram et al.

(10) Patent No.: US 9,496,254 B2
(45) Date of Patent: Nov. 15, 2016

(54) CAPACITOR USING MIDDLE OF LINE (MOL) CONDUCTIVE LAYERS

(71) Applicant: QUALCOMM Incorporated, San Diego, CA (US)

(72) Inventors: PR Chidambaram, San Diego, CA (US); Bin Yang, San Diego (CA)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/690,144

(22) Filed: Apr. 17, 2015

(65) Prior Publication Data

US 2015/0221638 A1    Aug. 6, 2015

Related U.S. Application Data

(63) Continuation of application No. 13/684,059, filed on Nov. 21, 2012, now Pat. No. 9,012,966.

(51) Int. Cl.
| | |
|---|---|
| H01L 23/52 | (2006.01) |
| H01L 27/06 | (2006.01) |
| H01L 49/02 | (2006.01) |
| H01L 23/522 | (2006.01) |

(52) U.S. Cl.
CPC ....... *H01L 27/0629* (2013.01); *H01L 23/5223* (2013.01); *H01L 23/5228* (2013.01); *H01L 28/20* (2013.01); *H01L 28/40* (2013.01); *H01L 28/60* (2013.01); *H01L 2924/0002* (2013.01)

(58) Field of Classification Search
CPC ........... H01L 23/5223; H01L 23/5228; H01L 27/0629; H01L 28/20; H01L 28/60
See application file for complete search history.

(56) References Cited

U.S. PATENT DOCUMENTS

| | | | |
|---|---|---|---|
| 5,406,447 A | 4/1995 | Miyazaki | |
| 5,614,727 A | 3/1997 | Mauri et al. | |
| 5,812,364 A | 9/1998 | Oku et al. | |
| 5,929,473 A | 7/1999 | Nishihori et al. | |
| 6,110,772 A * | 8/2000 | Takada | H01L 27/0635 257/E21.004 |
| 6,232,197 B1 | 5/2001 | Tsai | |
| 6,246,084 B1 | 6/2001 | Kim | |
| 6,291,307 B1 * | 9/2001 | Chu | H01L 21/76224 257/E21.008 |
| 6,300,682 B2 | 10/2001 | Chen | |
| 6,313,003 B1 | 11/2001 | Chen | |
| 6,340,832 B2 | 1/2002 | Kasahara | |
| 6,342,734 B1 | 1/2002 | Allman et al. | |
| 6,459,117 B1 | 10/2002 | Liou | |
| 6,492,224 B1 * | 12/2002 | Jao | H01L 21/76229 257/E21.008 |
| 6,503,793 B1 | 1/2003 | Chittipeddi et al. | |
| 6,576,526 B2 | 6/2003 | Kai et al. | |

(Continued)

OTHER PUBLICATIONS

International Search Report and Written Opinion—PCT/US2013/071347—ISA/EPO—Feb. 26, 2014.

*Primary Examiner* — Ida M Soward
(74) *Attorney, Agent, or Firm* — Alan Gordon; Kenneth Vu

(57) ABSTRACT

A method for fabricating a metal-insulator-metal (MIM) capacitor includes depositing a first middle of line (MOL) conductive layer over a shallow trench isolation (STI) region of a semiconductor substrate. The first MOL conductive layer provides a first plate of the MIM capacitor as well as a first set of local interconnects to source and drain regions of a semiconductor device. The method also includes depositing an insulator layer on the first MOL conductive layer as a dielectric layer of the MIM capacitor. The method further includes depositing a second MOL conductive layer on the insulator layer as a second plate of the MIM capacitor.

12 Claims, 13 Drawing Sheets

(56) References Cited

U.S. PATENT DOCUMENTS

| | | | |
|---|---|---|---|
| 6,661,049 B2 | 12/2003 | Tzeng et al. | |
| 6,740,974 B2 | 5/2004 | Yoshitomi | |
| 6,764,915 B2 | 7/2004 | Lee | |
| 6,770,926 B2 | 8/2004 | Kim | |
| 6,777,777 B1 | 8/2004 | Kar-Roy et al. | |
| 6,808,995 B2* | 10/2004 | Lin | H01L 29/66757 257/E21.413 |
| 6,818,936 B2 | 11/2004 | Lin et al. | |
| 6,885,081 B2* | 4/2005 | Morimoto | H01L 27/0808 257/306 |
| 6,940,114 B2 | 9/2005 | Oh et al. | |
| 6,982,472 B2 | 1/2006 | Kiyotoshi | |
| 7,018,890 B2* | 3/2006 | Tamura | H01L 27/11526 257/E21.679 |
| 7,022,246 B2 | 4/2006 | Chinthakindi et al. | |
| 7,180,116 B2 | 2/2007 | Chiang et al. | |
| 7,195,970 B2* | 3/2007 | Tu | H01L 28/91 257/E21.009 |
| 7,344,937 B2* | 3/2008 | Hong | H01L 27/0629 257/444 |
| 7,361,950 B2* | 4/2008 | Chinthakindi | H01L 28/40 257/301 |
| 7,425,740 B2* | 9/2008 | Liu | H01L 28/82 257/306 |
| 7,518,173 B2* | 4/2009 | Hikosaka | H01L 21/76816 257/295 |
| 7,557,399 B2* | 7/2009 | Tu | H01L 28/91 257/306 |
| 7,605,418 B2* | 10/2009 | Song | H01L 27/0629 257/296 |
| 7,611,942 B2* | 11/2009 | Minami | H01L 27/0629 257/E21.008 |
| 7,611,956 B2 | 11/2009 | Kim et al. | |
| 7,843,005 B2* | 11/2010 | Nowak | H01L 21/84 257/347 |
| 7,977,726 B2* | 7/2011 | Sim | H01L 27/1085 257/296 |
| 8,053,309 B2* | 11/2011 | Lee | H01L 21/823481 257/301 |
| 8,067,301 B2* | 11/2011 | Yi | H01L 27/14687 257/292 |
| 8,389,355 B2* | 3/2013 | Won | H01L 28/60 438/238 |
| 8,436,408 B2* | 5/2013 | Tu | H01L 23/5223 257/300 |
| 8,614,497 B2* | 12/2013 | Xia | H01L 27/0629 257/532 |
| 8,835,251 B2* | 9/2014 | Hu | H01L 27/0629 257/379 |
| 8,896,087 B2* | 11/2014 | Terletzki | H01L 27/0207 257/516 |
| 9,041,153 B2* | 5/2015 | Chen | H01L 23/5223 257/296 |
| 9,070,788 B2* | 6/2015 | Cheng | H01L 27/0629 |
| 2003/0080366 A1* | 5/2003 | Tamura | H01L 27/11526 257/298 |
| 2003/0183880 A1* | 10/2003 | Goto | H01L 27/0629 257/379 |
| 2004/0023417 A1* | 2/2004 | Cross | H01L 27/115 438/3 |
| 2004/0188777 A1* | 9/2004 | Hwang | H01L 27/112 257/403 |
| 2005/0156218 A1 | 7/2005 | Nirschl et al. | |
| 2005/0205918 A1 | 9/2005 | Abiko | |
| 2006/0008976 A1* | 1/2006 | Tu | H01L 21/31144 438/238 |
| 2007/0090417 A1 | 4/2007 | Kudo | |
| 2007/0158714 A1* | 7/2007 | Eshun | H01L 28/60 257/295 |
| 2007/0254417 A1* | 11/2007 | Chen | H01L 27/1085 438/155 |
| 2009/0004809 A1* | 1/2009 | Chinthakindi | H01L 28/40 438/393 |
| 2009/0179296 A1 | 7/2009 | Rhodes et al. | |
| 2009/0239351 A1* | 9/2009 | Aloni | H01L 28/60 438/396 |
| 2009/0250784 A1* | 10/2009 | Meinel | H01L 21/84 257/516 |
| 2010/0038692 A1 | 2/2010 | Chuang et al. | |
| 2010/0124806 A1 | 5/2010 | Lee | |
| 2010/0219502 A1 | 9/2010 | Shieh et al. | |
| 2011/0092035 A1 | 4/2011 | Hu et al. | |
| 2011/0097869 A1 | 4/2011 | Won et al. | |
| 2011/0241166 A1 | 10/2011 | Chumakov | |
| 2011/0309420 A1* | 12/2011 | Chang | H01L 23/5223 257/312 |
| 2012/0161299 A1 | 6/2012 | Gambino et al. | |
| 2013/0082351 A1 | 4/2013 | Chen et al. | |
| 2013/0241002 A1* | 9/2013 | Chiou | H01L 27/0629 257/380 |
| 2014/0138793 A1 | 5/2014 | Chidambaram et al. | |
| 2014/0145254 A1 | 5/2014 | Cheng et al. | |

\* cited by examiner

CAPACITOR USING MIDDLE OF LINE (MOL) CONDUCTIVE LAYERS

CROSS-REFERENCE TO RELATED APPLICATION

This application claims the benefit under 35 U.S.C. §119(e) to U.S. patent application Ser. No. 13/684,059, entitled CAPACITOR USING MIDDLE OF LINE (MOL) CONDUCTIVE LAYERS, filed on Nov. 21, 2012, in the names of PR Chidambaram, et al., the disclosure of which is expressly incorporated by reference herein in its entirety.

TECHNICAL FIELD

The present disclosure relates generally to capacitors. More specifically, the disclosure relates to a metal-insulator-metal (MIM) capacitors and also a method of manufacturing MIM capacitors using middle-of-line (MOL) conductive layers.

BACKGROUND

Capacitors are widely used in integrated circuits. Finger metal oxide metal (Fmom) capacitors are used in the current process technology (e.g., 28 nanometer (nm)). As technology scales down to 20 nm and beyond, however, variation of the thinner and slimmer metal wires used to implement Fmom capacitors becomes more and more severe, resulting in severe variation in the Fmom capacitance.

In current integrated circuit (IC) devices, a significant amount of small value (e.g., 20-30 fF) capacitors are specified. Although this was not an issue at 45 nm and older process technologies (due to a smaller variation in metal wire width/thickness (i.e., smaller capacitance variation)), starting at 28 nm, it becomes significantly more challenging to fabricate small value capacitance, while meeting design corners. Consequently, at 20 nm process technology and beyond, it will no longer be feasible to use Fmom capacitors to provide small value capacitance for IC devices.

A metal insulator metal (MIM) capacitor in the back end of line (BEOL) layers has been proposed. This solution, however, requires three additional masks as well as a high-K (HiK) oxide deposition process to achieve a high capacitor density.

SUMMARY

According to one aspect of the present disclosure, a method for fabricating a capacitor is described. The method includes depositing a first middle of line (MOL) conductive layer over a shallow trench isolation (STI) region of a semiconductor substrate. The first MOL conductive layer provides a first plate of the capacitor as well as a first set of local interconnects to source and drain regions of a semiconductor device. The method also includes depositing an insulator layer on the first MOL conductive layer as a dielectric layer of the capacitor. The method further includes depositing a second MOL conductive layer on the insulator layer as a second plate of the capacitor.

According to another aspect of the present disclosure, a metal-insulator-metal (MIM) capacitor device is described. The MIM capacitor device includes a semiconductor substrate. The MIM capacitor device may also include a first middle of line (MOL) conductive layer on the semiconductor substrate. The first MOL conductive layer provides a first plate of the MIM capacitor as well as a first set of local interconnects to source and drain regions of a semiconductor device. The MIM capacitor device may also include an insulator layer on the first capacitor plate to provide a dielectric layer of the MIM capacitor. The MIM capacitor device may further include a second MOL conductive layer on the insulator layer. The second MOL conductive layer provides a second plate of the MIM capacitor. The MIM capacitor device may also include a first interconnect coupled to the first capacitor plate and a second interconnect coupled to the second capacitor plate.

According to a further aspect of the present disclosure, a metal-insulator-metal (MIM) capacitor device is described. The MIM capacitor device includes a semiconductor substrate. The MIM capacitor device also includes a first middle of line (MOL) conductive layer, having a means for storing a first electric charge on the semiconductor substrate. The MIM capacitor device may also include an insulator layer on the first capacitor plate to provide a dielectric layer of the MIM capacitor. The device MIM capacitor may also include a second MOL conductive layer having a means for storing a second charge on the insulator layer that is disposed on the first electric charge storing means.

According to another aspect of the present disclosure, a method for fabricating a capacitor is described. The method includes the step of depositing a first middle of line (MOL) conductive layer over a shallow trench isolation (STI) region of a semiconductor substrate. The first MOL conductive layer provides a first plate of the capacitor as well as a first set of local interconnects to source and drain regions of a semiconductor device. The method also includes the step of depositing an insulator layer on the first MOL conductive layer as a dielectric layer of the capacitor. The method further includes the step of depositing a second MOL conductive layer on the insulator layer as a second plate of the capacitor.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

One aspect of the disclosure describes a MIM (metal-insulator-metal) capacitor formed using an existing middle of line interconnect layer as one electrode, and a conductive-resistor layer as another electrode to fabricate the MIM capacitor. In one configuration, a first plate of the MIM capacitor is provided by a first middle of line (MOL) interconnect layer that is disposed over a shallow trench isolation (STI) region of a semiconductor substrate. In this configuration, the first MOL conductive layer is an active contact (e.g., MD1) that provides a first set of local interconnects to the source and drain regions of a semiconductor device. A second plate of the capacitor is provided by a second MOL interconnect layer that is disposed on an insulator. The insulator is disposed on the first MOL interconnect layer.

In one configuration, the second MOL interconnect layer is provided by a conductive layer deposition and patterning to form the second plate of the capacitor. In this configuration, a second set of local interconnects (e.g., stacked contacts (MD2)) are coupled to the first and second capacitor plates as well as the first set of local interconnects (e.g., active contacts MD1). Accordingly, one aspect of the present disclosure uses an MOL interconnect layer (MD1) as one electrode and an MOL conductive resistor layer (introduced in a current process technology) to fabricate an MIM capacitor without additional masks or layers. In another aspect of the disclosure, a high density MIM capacitor is providing by using an additional high-K deposition, including one lithography (1 mask) step and one additional etch step.

Figure 1:
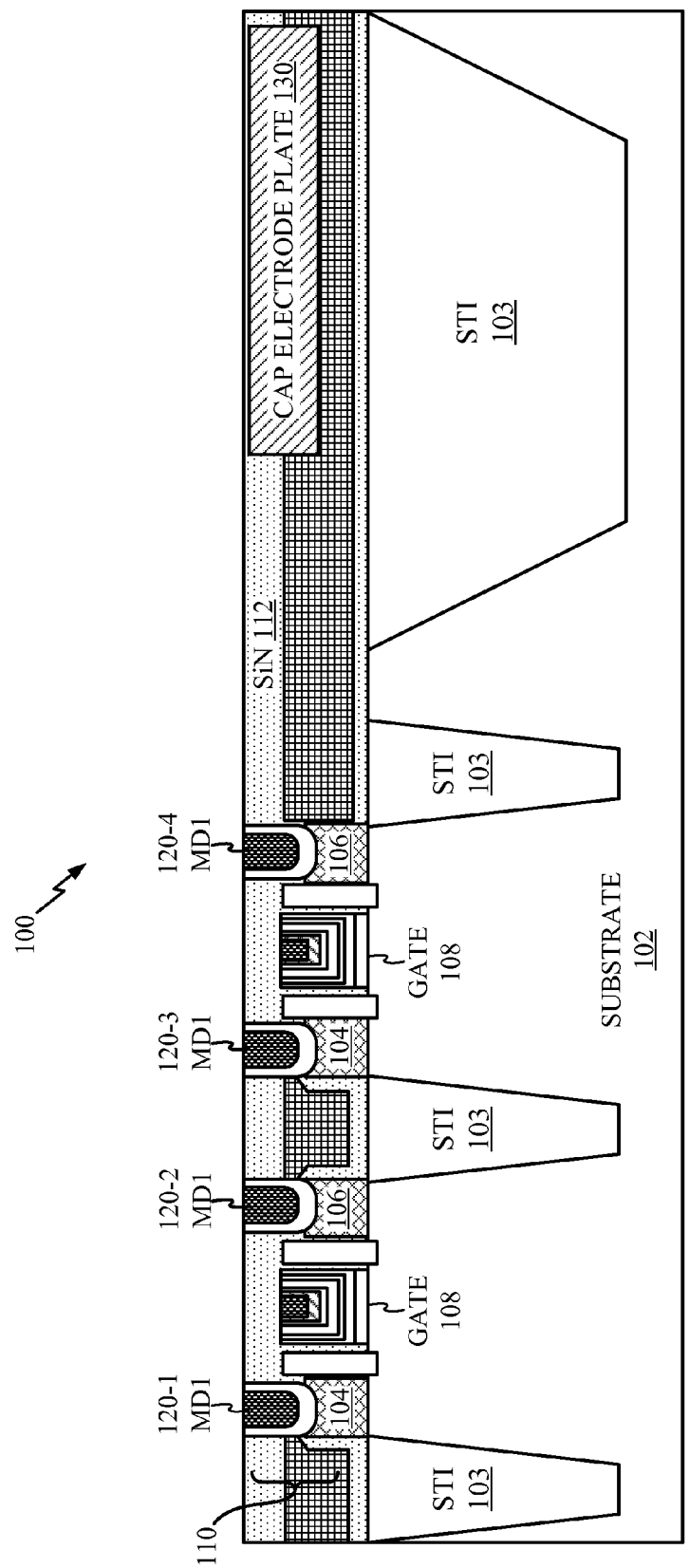
FIG. 1 shows a cross-sectional view illustrating an integrated circuit (IC) device including a first capacitor plate within a middle of line interconnect layer according to one aspect of the disclosure.

FIG. 1 shows a cross-sectional view illustrating an integrated circuit (IC) device 100 including a first capacitor plate within a middle of line (MOL) interconnect layer 110 according to one aspect of the disclosure. Representatively, the IC device 100 includes a semiconductor substrate (e.g., a silicon wafer) 102 having shallow trench isolation (STI) regions 103. Above the STI region 103 and the semiconductor substrate 102 is an active region in which active devices having a source region 104, a drain region 106, and a gate region 108 are formed. A silicon nitride layer 112, having a thickness of approximately 30 nanometers is deposited over the active region to protect the active devices. Also provided is a middle of line (MOL) interconnect layer 110.

In FIG. 1, the first MOL interconnect layer 110 includes a set of active (oxide diffusion (OD)) contacts (MD1) 120 (120-1-120-4) that are fabricated on the semiconductor substrate 102 using existing process technology. The active contacts 120 are coupled to the source region 104 and the drain region of the active devices. In this aspect of the disclosure, a first capacitor plate (electrode) 130 is defined within the MOL interconnect layer 110 over the STI region 103 of the semiconductor substrate 102. Once defined, a first MOL conductive layer is deposited to form the first capacitor electrode plate 130. The first MOL conductive layer also provides a first set of local interconnects (active contacts 120) to the source region 104 and drain region 106 of the active devices. In this configuration, the first MOL conductive layer, used to form the active contacts 120, is also used to form an electrode of a capacitor as the first capacitor electrode plate 130. The first MOL conductive layer may be composed of tungsten or other like conductive material.

Figure 2:
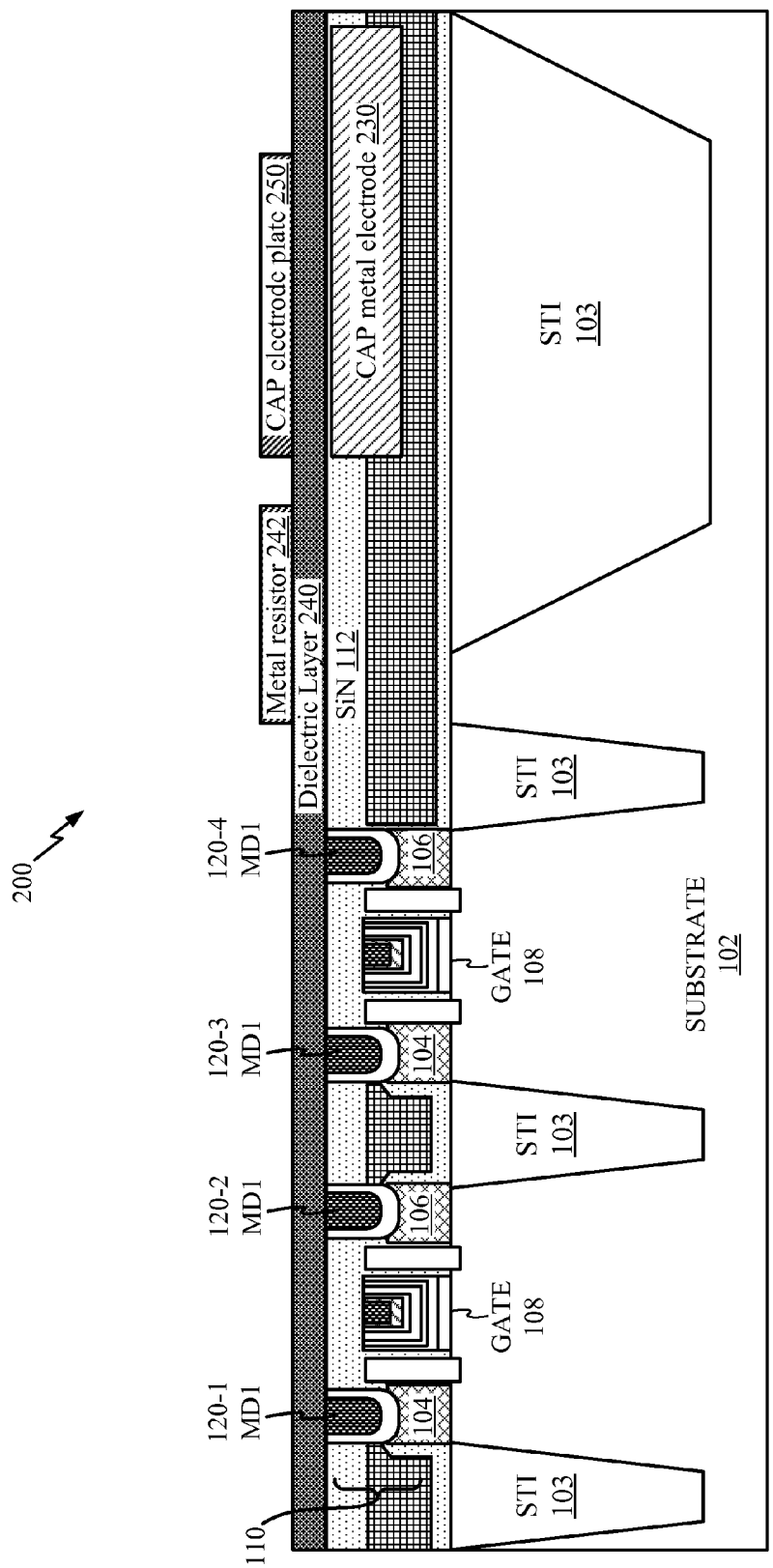
FIG. 2 shows a cross-sectional view illustrating the IC device of FIG. 1 including a second capacitor plate above the middle of line interconnect layer according to one aspect of the disclosure.

FIG. 2 shows a cross-sectional view illustrating an integrated circuit (IC) device 200 including a second capacitor electrode plate 250 above the MOL interconnect layer 110 according to one aspect of the disclosure. Representatively, a first dielectric layer (e.g., an oxide layer) 240 is deposited over the active contacts 120 and the first capacitor electrode plate 230. The first dielectric layer 240 may have a thickness in the range of 10 to 15 nanometers.

In this configuration, a second MOL conductive layer is deposited onto the surface of the first dielectric layer 240. The second MOL conductive layer is patterned and etched to form a second capacitor electrode plate 250 over the first capacitor electrode plate 230. In this configuration, a capacitance value of a capacitor formed from the first capacitor electrode plate 230 and the second capacitor electrode plate 250 is determined by the thickness of the first dielectric layer 240. A conductive resistor 242 is also formed on the first dielectric layer 240. In this aspect of the disclosure, an MOL conductive resistor layer deposition and patterning is also used to provide a second conductive electrode as the second capacitor electrode plate 250.

Figure 3:
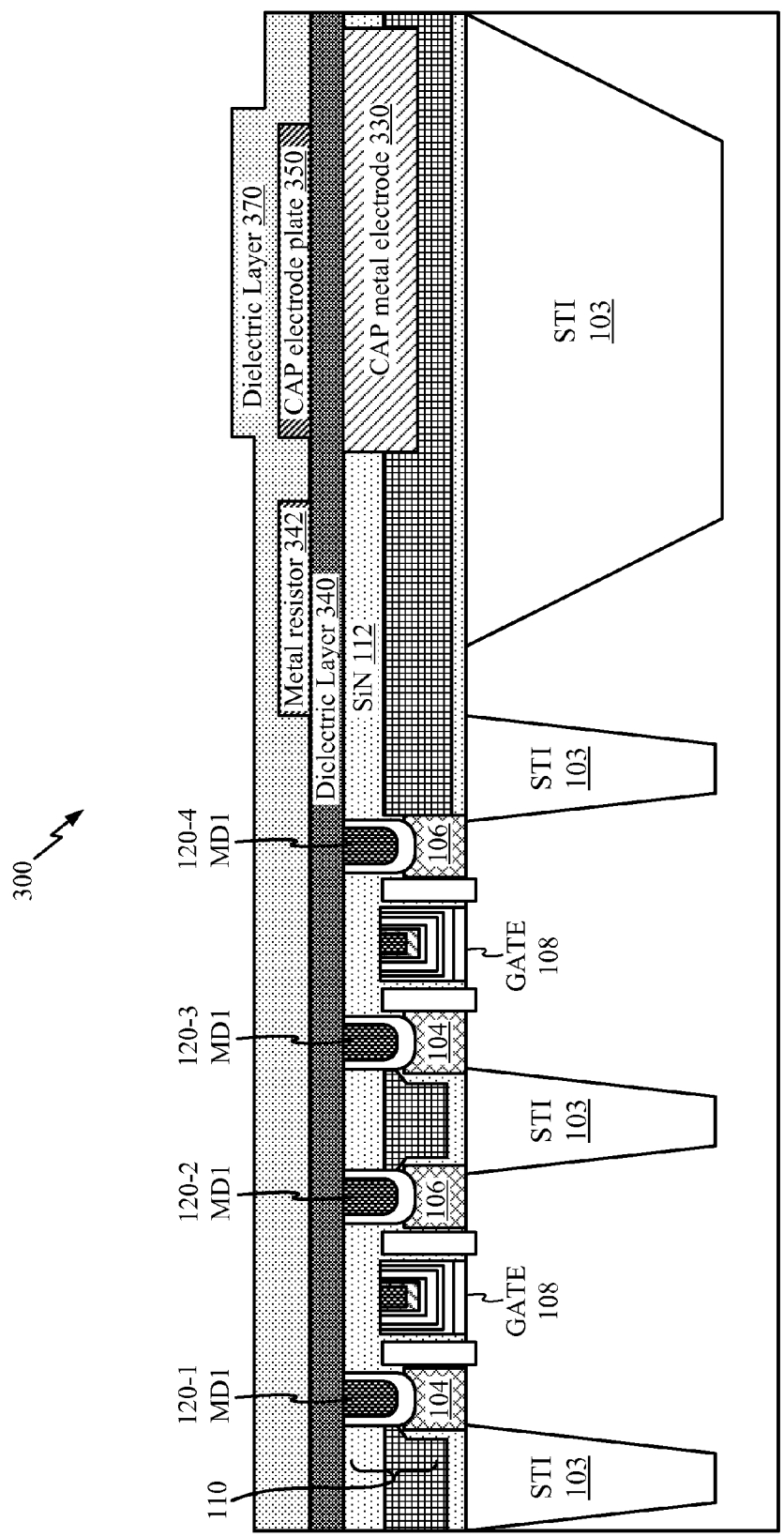
FIG. 3 shows a cross-sectional view illustrating an IC device of FIG. 2 including a second capacitor plate above the middle of line interconnect layer and a second dielectric layer disposed onto the first dielectric layer according to one aspect of the disclosure.

FIG. 3 shows a cross-sectional view illustrating an IC device 300 including a second capacitor electrode plate 350 above the MOL interconnect layer 110 and a second dielectric layer 370 disposed onto the first dielectric layer 340 according to one aspect of the disclosure. In this configuration, the second dielectric layer 370, having a thickness in the range of 35 nanometers, is deposited over the first dielectric layer 340, the resistor 342 and the second capacitor electrode plate 350, above the first capacitor electrode plate 330.

Figure 4:
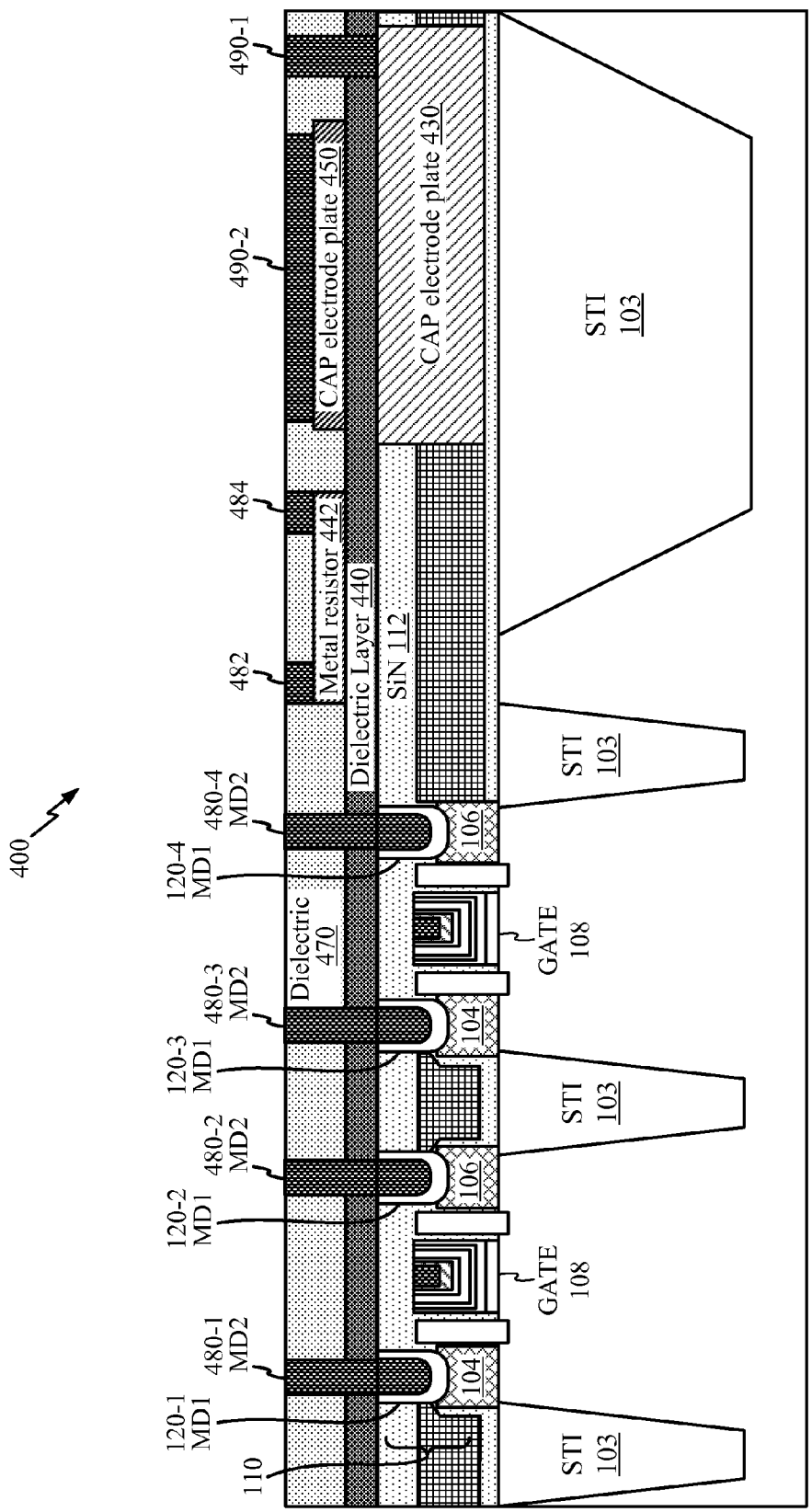
FIG. 4 shows a cross-sectional view illustrating an IC device of FIG. 3 including interconnects to first and second capacitor plates, according to one aspect of the disclosure.

FIG. 4 shows a cross-sectional view illustrating an IC device 400 including interconnects to 490-1 and 490-2 to the first capacitor electrode plate 430 and the second capacitor electrode plate 450, according to one aspect of the disclosure. In this configuration, the second dielectric layer 470 is patterned and etched to expose the first capacitor electrode plate 430 and the second capacitor electrode plate 450. This patterning and etching is performed to expose the resistor 442 and the active contacts 120 as part of the current process technology. Once exposed, a third MOL conductive layer is deposited over the second dielectric layer 470 to form interconnects 490 (490-1 and 490-2) to the first capacitor electrode plate 430 and the second capacitor electrode plate 450, respectively.

In this configuration, the third MOL conductive layer also provides a second set of local interconnects (stacked contacts (MD2) 480 (480-1-480-4) to the active contacts 120 using existing process technology. In this configuration, the third MOL conductive layer, which used to form the stacked contacts 480 and the interconnects 482 and 484 to the resistor, is also used to form the interconnect 490-1 to the first capacitor electrode plate 430 and the interconnect 490-2 to the second capacitor electrode plate 450.

Figure 5:
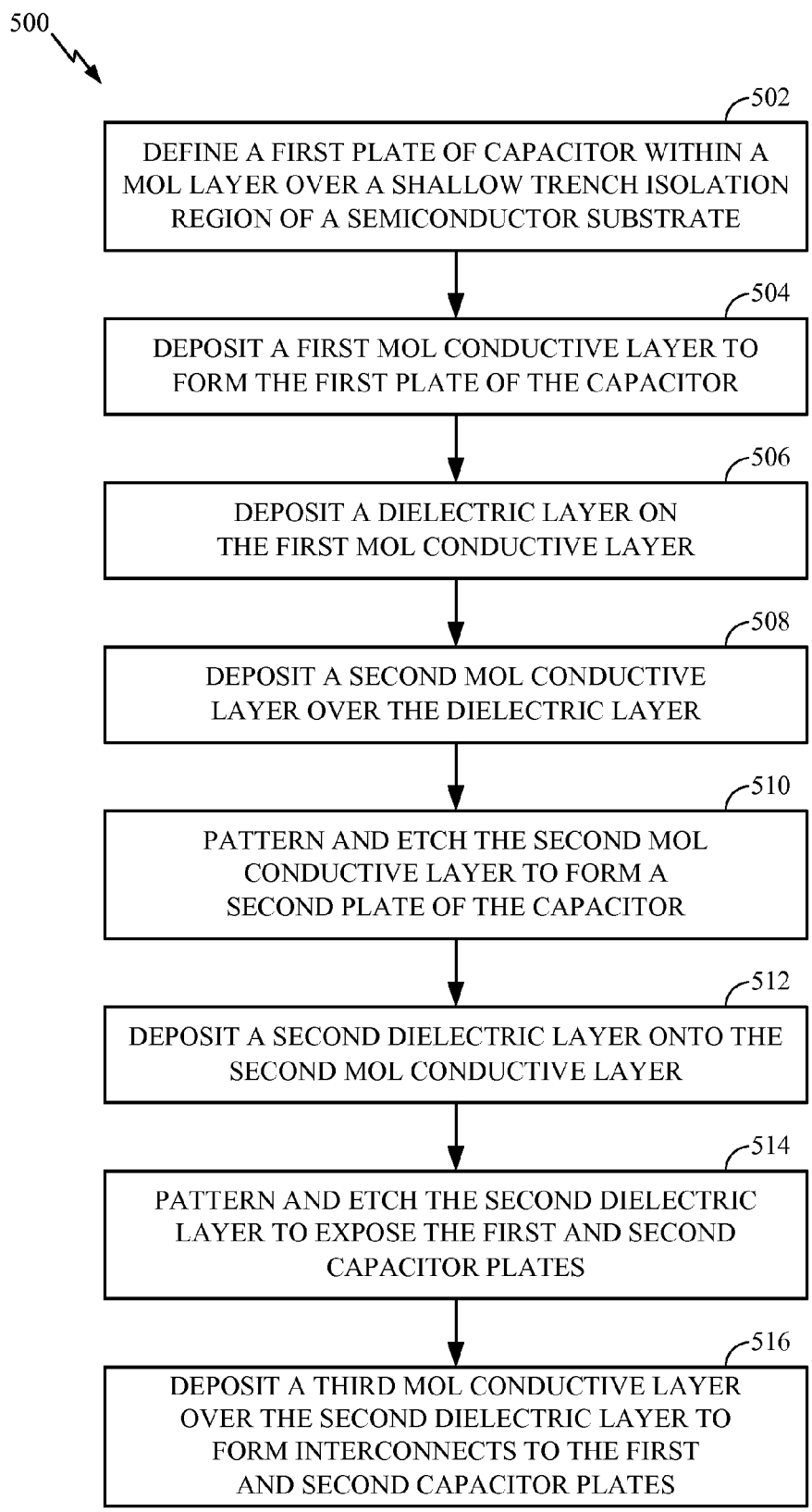
FIG. 5 illustrates a method for fabricating a metal-insulator-metal (MIM) capacitor using middle-of-line (MOL) interconnect layers according to an aspect of the present disclosure.

FIG. 5 illustrates a method 500 for fabricating a metal-insulator-metal (MIM) capacitor using middle-of-line (MOL) conductive layers according to an aspect of the present disclosure. In block 502, a first plate of the capacitor is defined within a middle of line (MOL) interconnect layer over a shallow trench isolation (STI) region of a semiconductor substrate. In block 504, a first MOL conductive layer is deposited to form the first plate of a capacitor. For example, as shown in FIG. 1, a first capacitor plate (electrode) 130 is defined within the MOL interconnect layer 110 over the STI region 103 of the semiconductor substrate 102. Once defined, a first MOL conductive layer is deposited to form the first capacitor electrode plate 130.

Referring again to FIG. 5, at block 506 a dielectric layer is deposited on the first MOL conductive layer. For example, as shown in FIG. 2, a first dielectric layer (e.g., an oxide layer) 240 is deposited over the active contacts 120 and the first capacitor electrode plate 230. At block 508, a second MOL conductive layer is deposited over the first dielectric layer. At block 510, the second MOL conductive is patterned and etched to form a second plate of the capacitor. For example, as shown in FIG. 2, a second MOL conductive layer is deposited onto the surface of the first dielectric layer 240. The second MOL conductive layer is patterned and etched to form a second capacitor electrode plate 250 over the first capacitor electrode plate 230.

At block 512, a second dielectric layer is deposited onto the second MOL conductive layer. At block 514, the second dielectric layer is patterned and etched to expose the first and second capacitor plates. At block 516, a third MOL conductive layer is deposited over the second dielectric layer to form interconnects to the first and second capacitor plates. The third MOL conductive layer is patterned to form interconnects to the first and second capacitor electrode plates For example, as shown in FIG. 4, the second dielectric layer 470 is patterned and etched to expose the first capacitor electrode plate 430 and the second capacitor electrode plate 450. This patterning and etching is performed to expose the resistor 442 and the active contacts 120 as part of the current process technology. Once exposed, a third MOL conductive layer is deposited over the second dielectric layer 470 to form interconnects 490 (490-1 and 490-2) to the first capacitor electrode plate 430 and the second capacitor electrode plate 450, respectively.

As described in FIGS. 1 to 5, a metal-insulator-metal (MIM) capacitor may be implemented using the masks and processes currently used for fabricating the MOL layers available in current process technologies at no additional cost. The capacitance value of the MIM capacitor is determined by the thickness of the first dielectric layer. The thickness of the first dielectric layer can be determined by the foundry. In another aspect of the disclosure, a high density MIM capacitor is formed with the use of existing process technology and one extra mask to provide a high-K dielectric layer, for example, as described in FIGS. 6-11.

Figure 6:
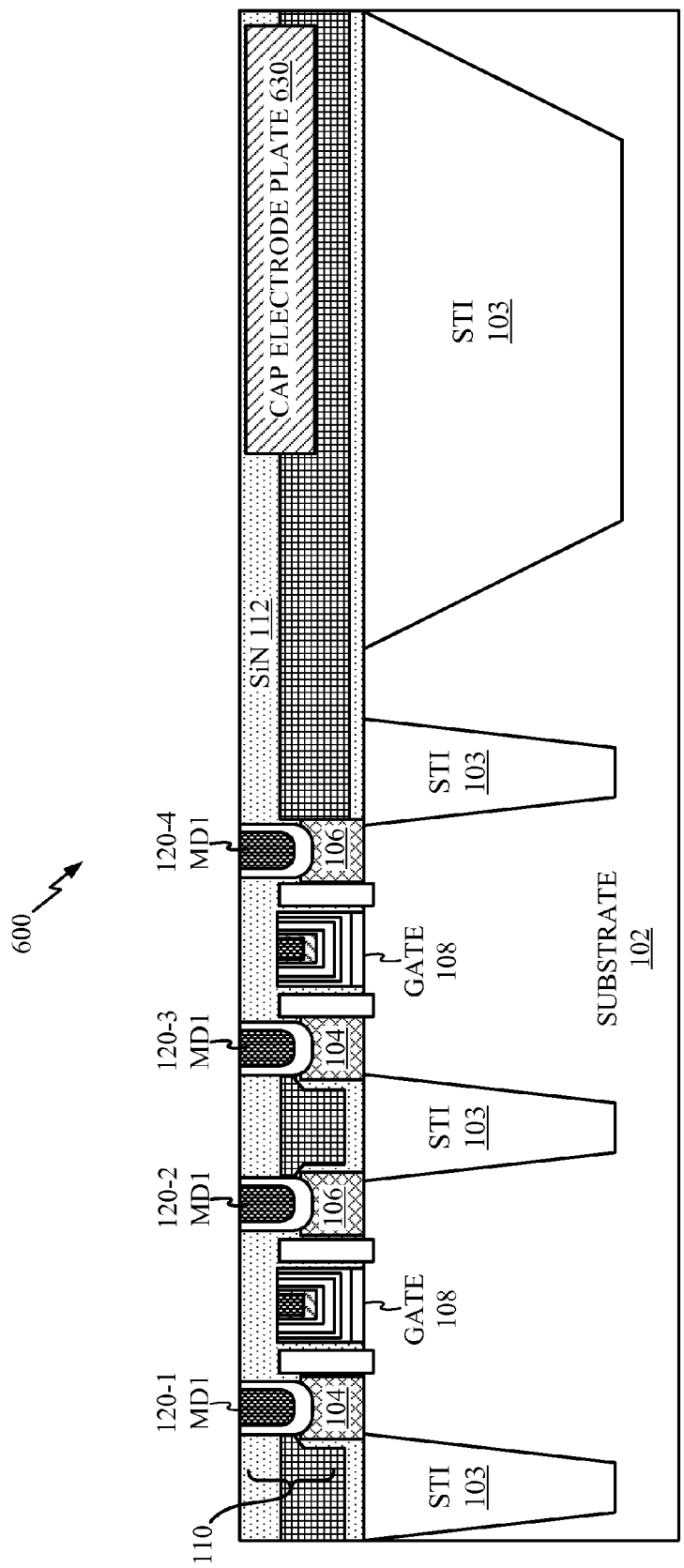
FIG. 6 shows a cross-sectional view illustrating an integrated circuit (IC) device including a first capacitor plate within a middle of line interconnect layer according to one aspect of the disclosure.

FIG. 6 shows a cross-sectional view illustrating an integrated circuit (IC) device 600 including a first capacitor electrode plate 630 within the MOL interconnect layer 110 according to one aspect of the disclosure. This configuration of the IC device may be similar to the configuration of the IC device 100 shown in FIG. 1. In this configuration, however, the first capacitor electrode plate 630 provides a first electrode of a high density capacitor.

Figure 7:
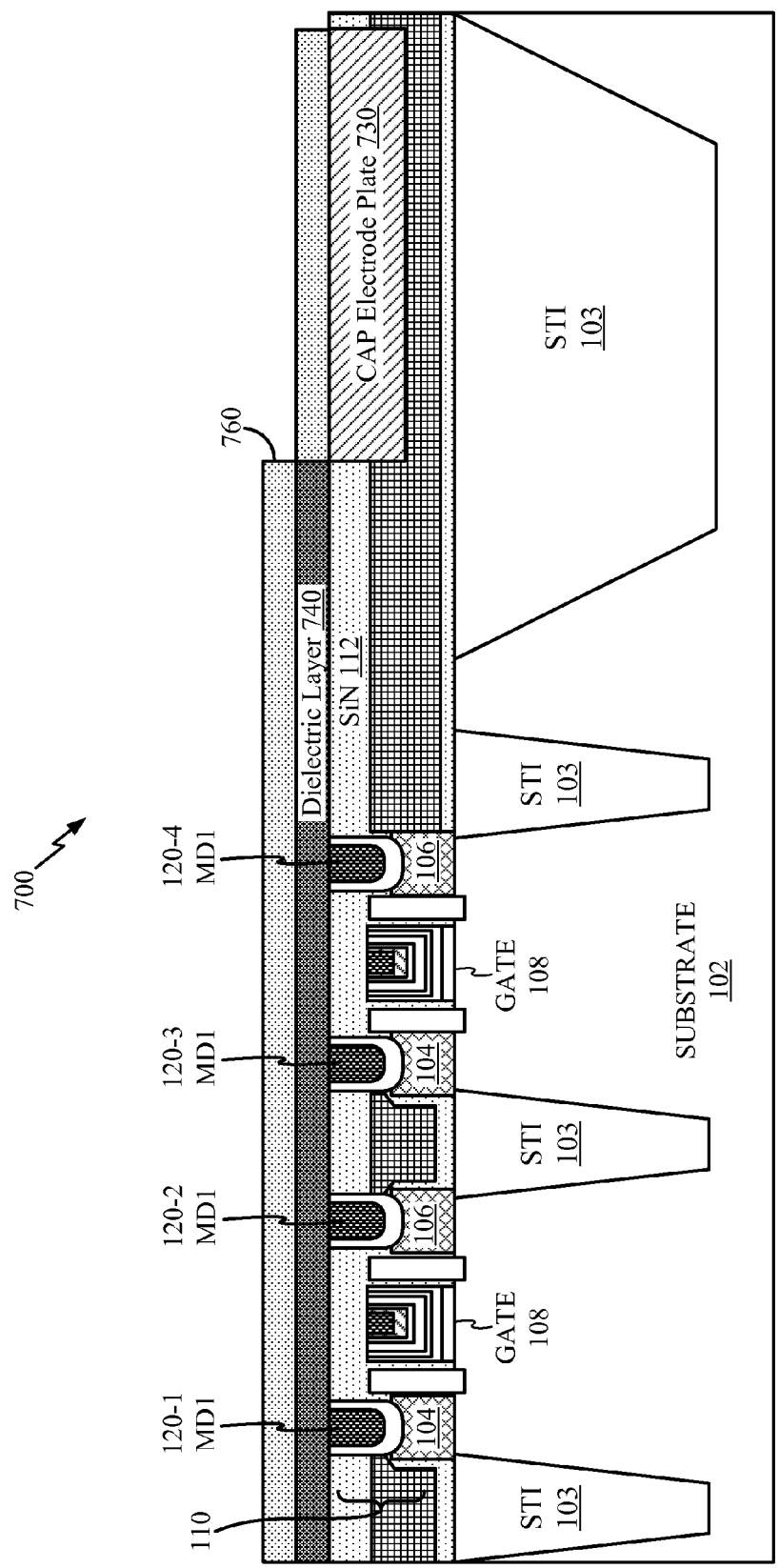
FIG. 7 shows a cross-sectional view illustrating the IC device of FIG. 6 including a high-K dielectric layer disposed on the first capacitor plate within the middle of line interconnect layer according to one aspect of the disclosure.

FIG. 7 shows a cross-sectional view illustrating the IC device 700 of FIG. 6 including a high-K dielectric layer 760 disposed on the first capacitor electrode plate 730 within the MOL interconnect layer 110 according to one aspect of the disclosure. In this configuration, a first dielectric layer (e.g., an oxide layer) 740 is deposited over the active contacts 120 and the first capacitor electrode plate 730. The first dielectric layer 740 may have a thickness in the range of 10 to 15 nanometers. The deposition of the first dielectric layer 740 may be similar to the first dielectric layer deposition shown in FIG. 2. In this configuration, however, the first dielectric layer 740 is masked and etched to expose the first capacitor electrode plate 730. When the first capacitor electrode plate 730 is exposed, a high-K dielectric layer 760 is deposited on the first dielectric layer 740 and an exposed surface of the first capacitor electrode plate 730, in this aspect of the disclosure. A thickness of the high-K dielectric layer 760 is in the range of 2 to 5 nanometers.

Figure 8:
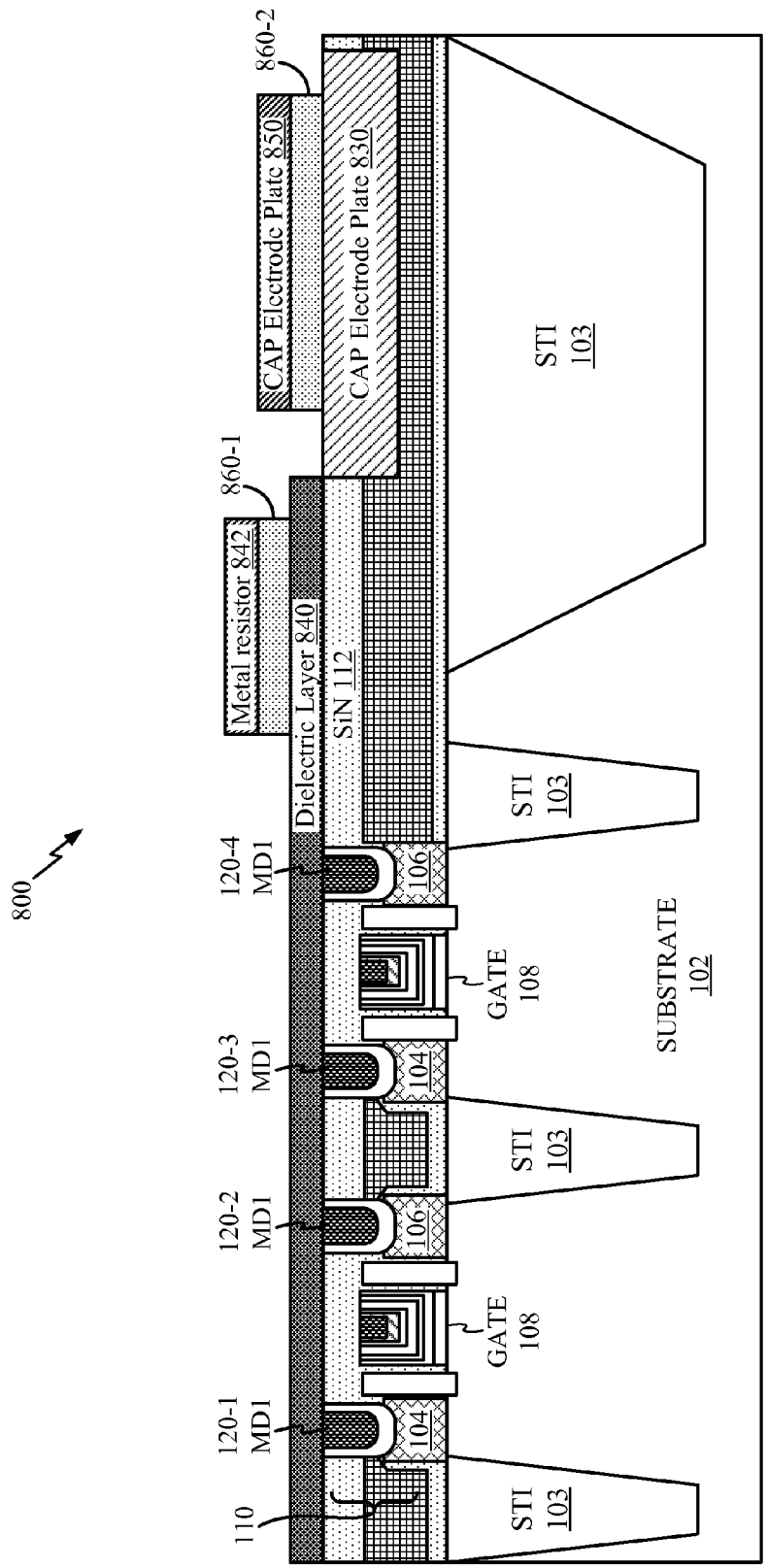
FIG. 8 shows a cross-sectional view illustrating the IC device of FIG. 7 including a second capacitor plate disposed on the high-K dielectric layer above the first capacitor plate according to one aspect of the disclosure.

FIG. 8 shows a cross-sectional view illustrating the IC device 800 of FIG. 7 including a second capacitor electrode plate 850 and a conductive resistor 842 disposed on the high-K dielectric layer 860 (860-1, 860-2) above the MOL interconnect layer 110 according to one aspect of the disclosure. In this configuration, a second MOL conductive layer is deposited onto the surface of high-K dielectric layer 860. The second MOL conductive layer is patterned and etched to form a second capacitor electrode plate 850 over the first capacitor electrode plate 830 and to expose the first dielectric layer 840. In this configuration, a high density capacitor is formed from the first capacitor electrode plate 830 and the second capacitor electrode plate 850 due to the reduced thickness (e.g., 2 to 5 nanometers) of the high-K dielectric layer 860-2 between the first capacitor electrode plate 830 and second capacitor electrode plate 850. The conductive resistor 842 is also formed on the high-K dielectric layer 860-1, over the first dielectric layer 840. In this aspect of the disclosure, an MOL conductive resistor layer deposition and patterning provides a second conductive electrode as the second capacitor electrode plate 850.

Figure 9:
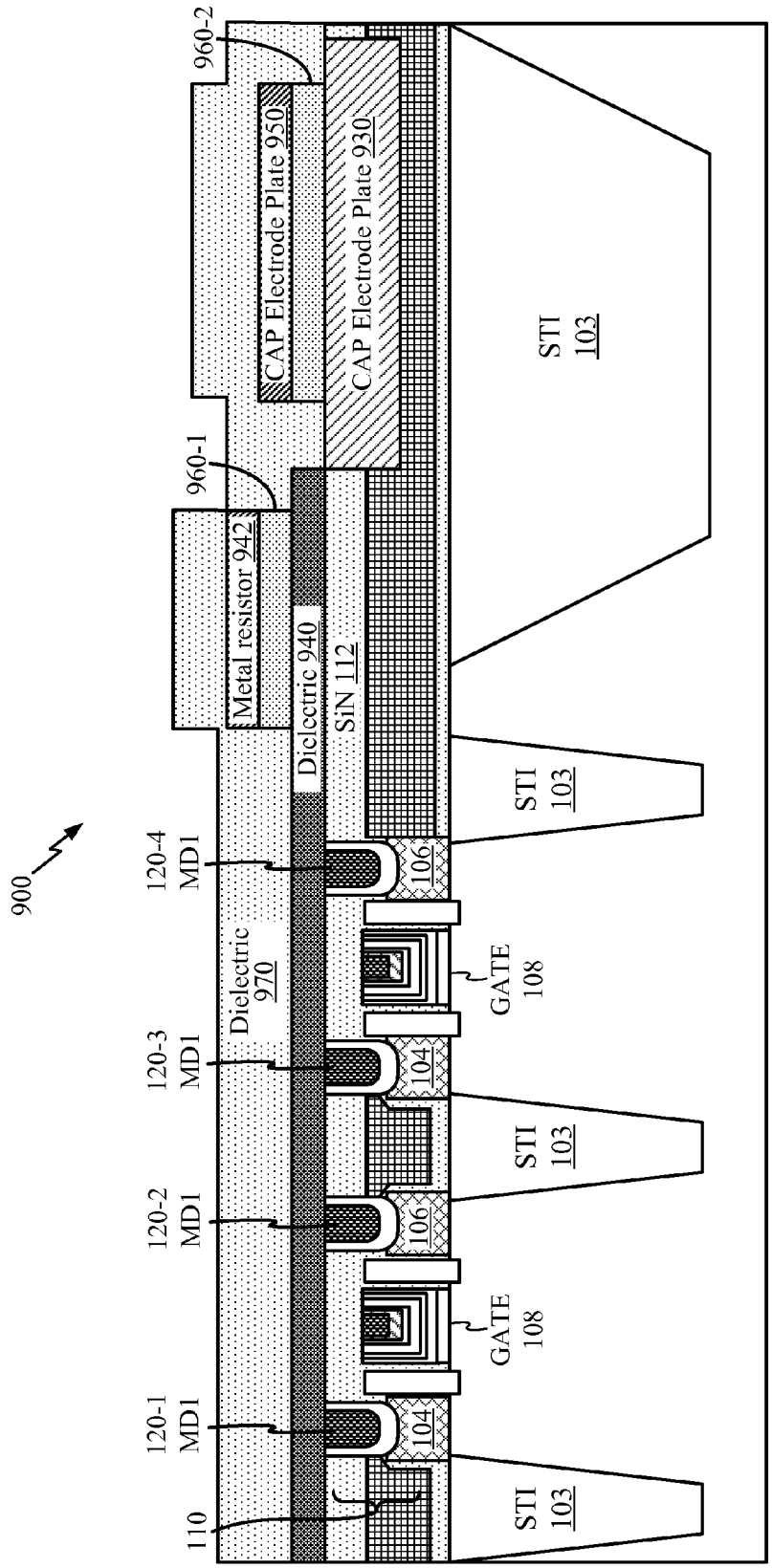
FIG. 9 shows a cross-sectional view illustrating the IC device of FIG. 8 including a second dielectric layer disposed onto the first dielectric layer according to one aspect of the disclosure.

FIG. 9 shows a cross-sectional view illustrating the IC device 900 of FIG. 8 including a second dielectric layer 970 disposed onto the first dielectric layer 940, the resistor 942 and the second capacitor electrode plate 950 according to one aspect of the disclosure. In this configuration, the second dielectric layer 970, having a thickness in the range of 35 nanometers, is deposited over the first dielectric layer 940, the resistor 942, the second capacitor electrode plate 950, and the sidewalls of the high-K dielectric layers 960-1 and 960-2.

Figure 10:
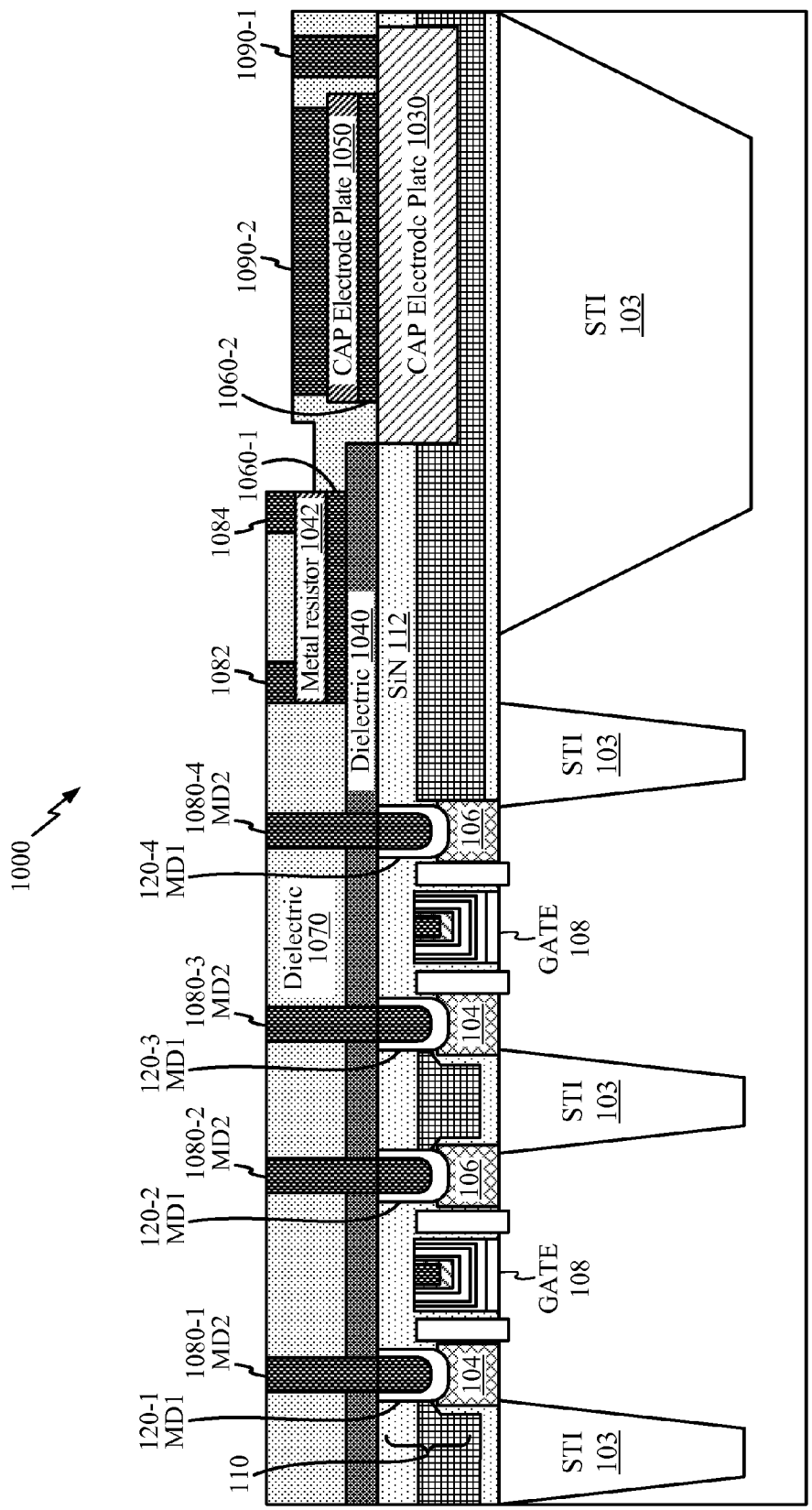
FIG. 10 shows a cross-sectional view illustrating the IC device of FIG. 9 including interconnects to first and second capacitor plates of a high density capacitor, according to one aspect of the disclosure.

FIG. 10 shows a cross-sectional view illustrating an IC device 1000 including interconnects to 1090-1 and 1090-2 to the first capacitor electrode plate 1030 and the second capacitor electrode plate 1050, according to one aspect of the disclosure. In this configuration, the second dielectric layer 1070 is patterned and etched to expose the first capacitor electrode plate 1030 and the second capacitor electrode plate 1050. This patterning and etching is also performed to expose the resistor 1042 and the active contacts 120 below the first dielectric layer 1040 as part of the current process technology. Once exposed, a third MOL conductive layer is deposited over the second dielectric layer 1070 to form an interconnect 1090-1 to the first capacitor electrode plate 1030 and an interconnect 1090-2 to the second capacitor electrode plate 1050.

In this configuration, the third MOL conductive layer also provides a second set of local interconnects (stacked contacts (MD2) 1080 (1080-1-1080-4) to the active contacts 120 using existing process technology. In this configuration, the third MOL conductive layer, used to form the stacked contacts 1080 and the interconnects 1082 and 1084 to the resistor 1042, is also used to form the interconnect 1090-1 to the first capacitor electrode plate 1030 and the interconnect 1090-2 to the second capacitor electrode plate 1050. The resistor 1042 is disposed on the high-K dielectric layer 1060-1 and the second capacitor electrode plate 1050 is disposed on the high-K dielectric layer 1060-2.

Figure 11:
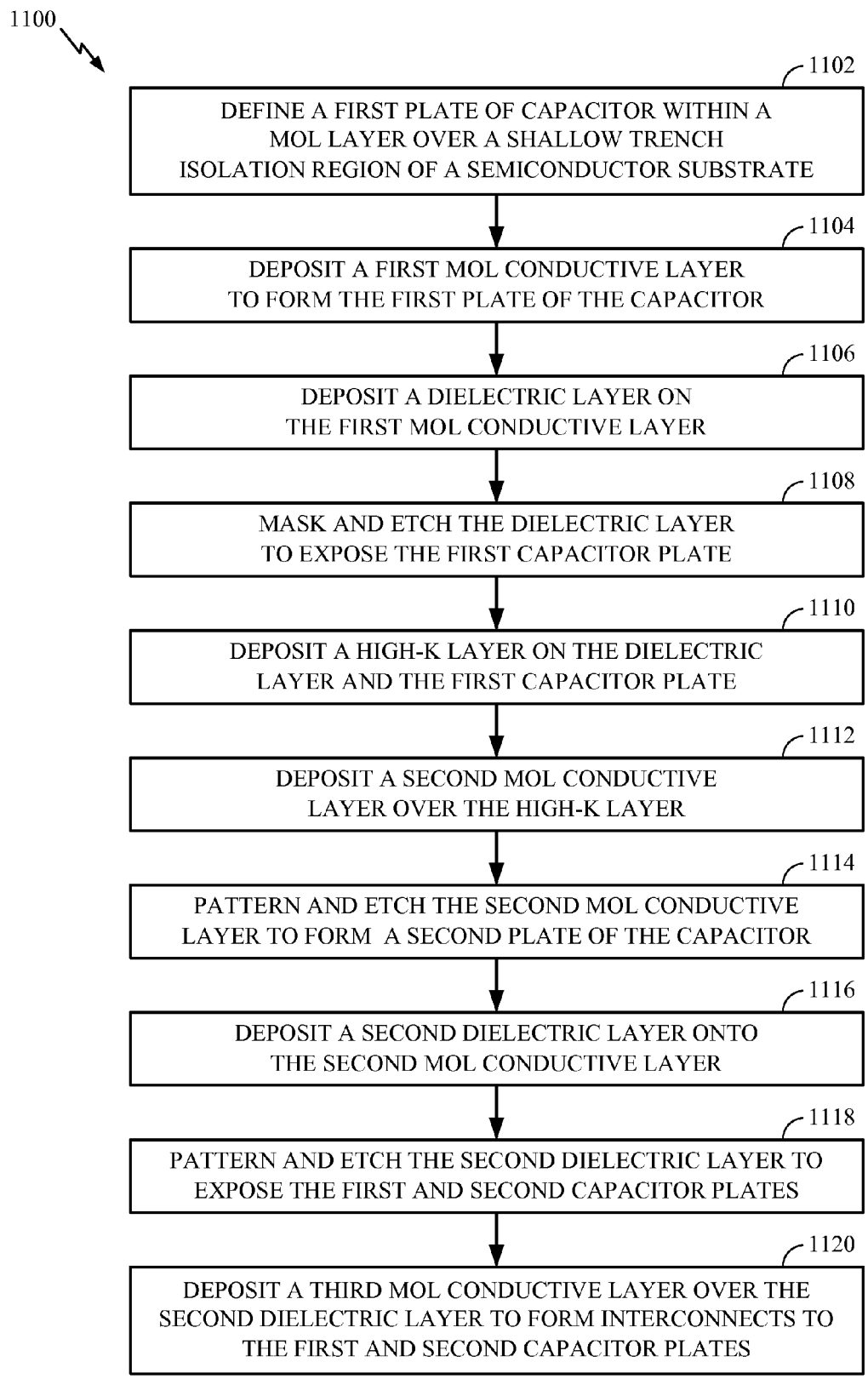
FIG. 11 illustrates a method for fabricating a high density metal-insulator-metal (MIM) capacitor using middle-of-line (MOL) interconnect layers according to an aspect of the present disclosure.

FIG. 11 illustrates a method 1100 for fabricating a metal-insulator-metal (MIM) high density capacitor using middle-of-line (MOL) conductive layers according to an aspect of the present disclosure. In block 1102, a first plate of capacitor is defined within a middle of line (MOL) interconnect layer over a shallow trench isolation (STI) region of a semiconductor substrate. In block 1104, a first MOL conductive layer is deposited to form the first plate of a capacitor. For example, as shown in FIG. 6, a first capacitor plate (electrode) 630 is defined within the MOL interconnect layer 110 over the STI region 103 of the semiconductor substrate 102. Once defined, a first MOL conductive layer is deposited to form the first capacitor electrode plate 630.

Referring again to FIG. 11, at block 1106 a first dielectric layer is deposited on the first MOL conductive layer. For example, as shown in FIG. 7, a first dielectric layer (e.g., an oxide layer) 740 is deposited over the active contacts 120 and the first capacitor electrode plate 730. At block 1108, the dielectric layer is masked and etched to expose the first capacitor plate. When the first capacitor plate is exposed, a high-K dielectric layer is deposited on the first dielectric layer 740 and an exposed surface of the first capacitor electrode plate 730, as shown in block 1110 and FIG. 7.

At block 1112, a second MOL conductive layer is deposited over the high-K dielectric layer. At block 1114, the second MOL conductive layer is patterned and etched to form a second plate of the capacitor. For example, as shown in FIG. 8, a second MOL conductive layer is deposited onto the surface of high-K dielectric layer 860. The second MOL conductive layer is patterned and etched to form a second capacitor electrode plate 850 over the first capacitor electrode plate 830, and expose the first dielectric layer 840.

At block 1116, a second dielectric layer is deposited onto the second MOL conductive layer. At block 1118, the second dielectric layer is patterned and etched to expose the first and second capacitor plates. At block 1120, a third MOL conductive layer is deposited over the second dielectric layer to form interconnects to the first and second capacitor plates. For example, as shown in FIG. 10, the second dielectric layer 1070 is patterned and etched to expose the first capacitor electrode plate 1030 and the second capacitor electrode plate 1050. This patterning and etching is performed to expose the resistor 1042 and the active contacts 120 as part of the current process technology. Once exposed, a third MOL conductive layer is deposited over the second dielectric layer 1070 to form an interconnect 1090-1 to the first capacitor electrode plate 1030 and the second capacitor electrode plate 1050.

In one configuration, a metal-insulator-metal (MIM) capacitor device includes a first middle of line (MOL) conductive layer, having a means for storing a first electric charge on a semiconductor substrate. In one aspect of the disclosure, the first electric charge storing means may be the first capacitor plate 430/1030 configured to perform the functions recited by the first electric charge storing means. The device may also include a second MOL conductive layer having a means for storing a second charge on an insulator layer that is disposed on the first electric charge storing means. In one aspect of the disclosure, the second electric charge storing may be the second capacitor plate 450/1050 configured to perform the functions recited by the second electric charge storing means. In another aspect, the aforementioned means may be any device configured to perform the functions recited by the aforementioned means.

Figure 12:
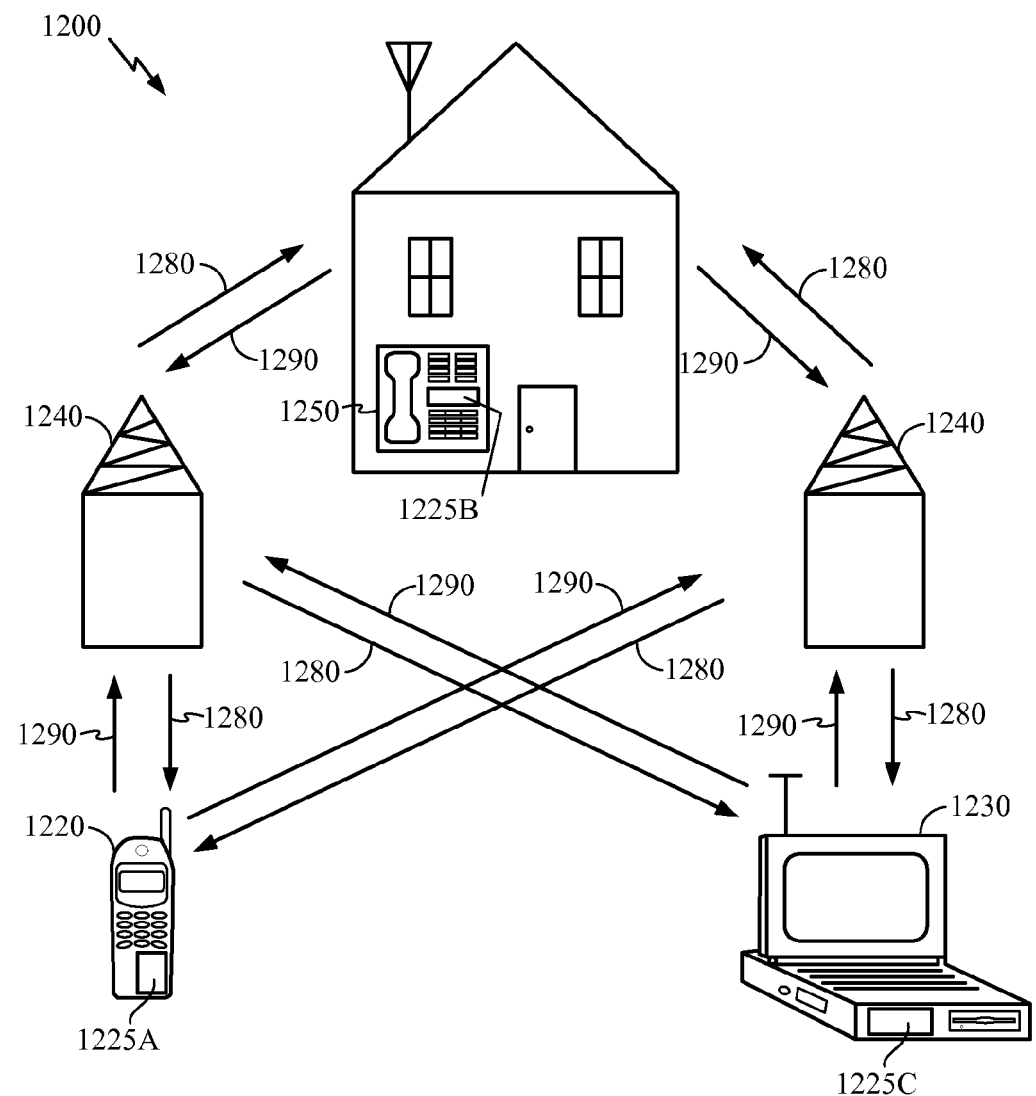
FIG. 12 shows an exemplary wireless communication system in which an aspect of the disclosure may be advantageously employed.

FIG. 12 shows an exemplary wireless communication system 1200 in which an aspect of the disclosure may be advantageously employed. For purposes of illustration, FIG. 12 shows three remote units 1220, 1230, and 1250 and two base stations 1240. It will be recognized that wireless communication systems may have many more remote units and base stations. Remote units 1220, 1230, and 1250 include MIM capacitors 1225A, 1225B, 1225C. FIG. 12 shows forward link signals 1280 from the base stations 1240 and the remote units 1220, 1230, and 1250 and reverse link signals 1290 from the remote units 1220, 1230, and 1250 to base stations 1240.

In FIG. 12, the remote unit 1220 is shown as a mobile telephone, remote unit 1230 is shown as a portable computer, and remote unit 1250 is shown as a fixed location remote unit in a wireless local loop system. For example, the remote units may be cell phones, hand-held personal communication systems (PCS) units, a set top box, a music player, a video player, an entertainment unit, a navigation device, portable data units, such as personal data assistants, or fixed location data units such as meter reading equipment. Although FIG. 12 illustrates remote units, which may employ MIM capacitors 1225A, 1225B, 1225C according to the teachings of the disclosure, the disclosure is not limited to these exemplary illustrated units. For instance, an MIM capacitor according to aspects of the present disclosure may be suitably employed in any device.

Figure 13:
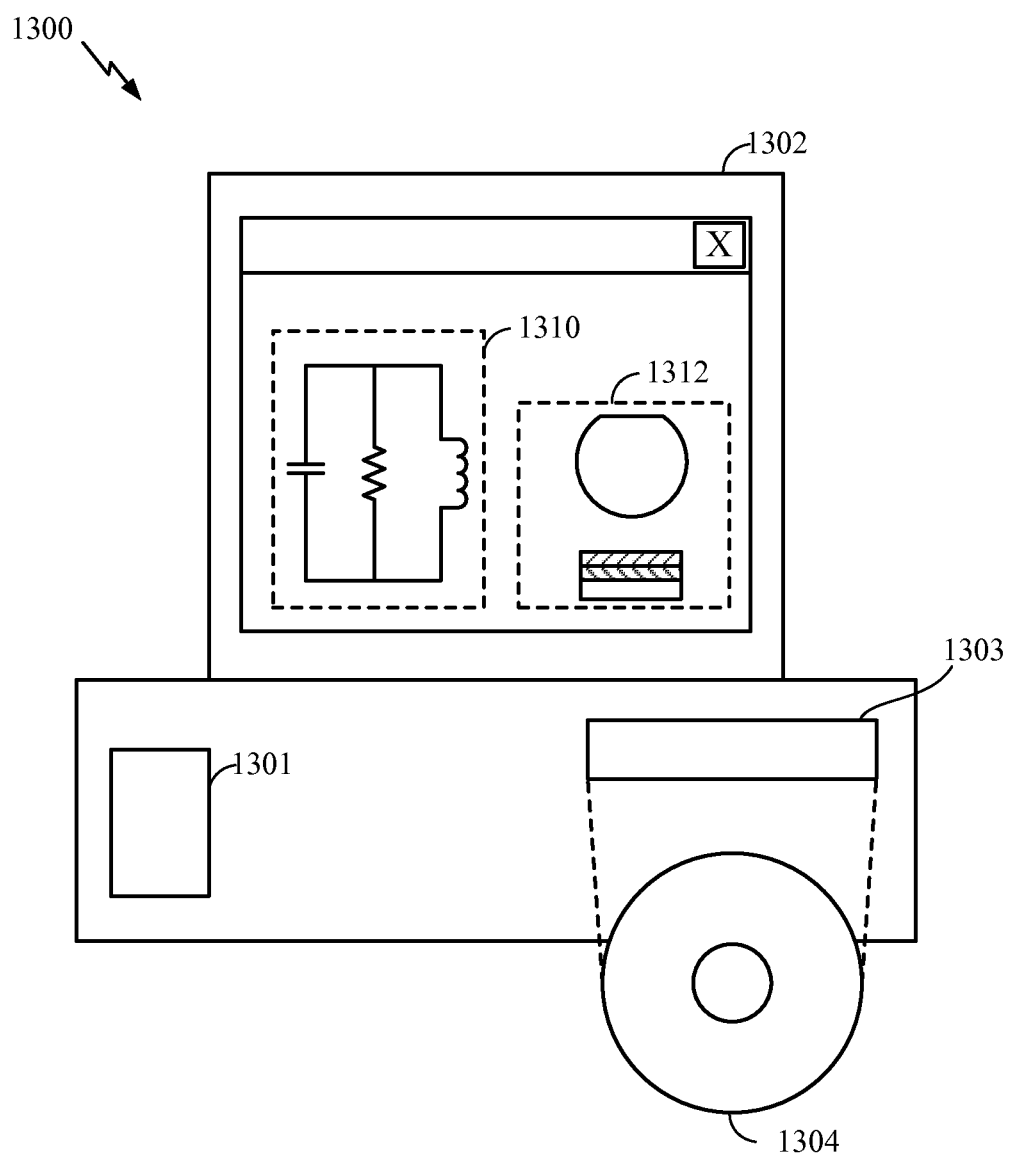
FIG. 13 is a block diagram illustrating a design workstation used for circuit, layout, and logic design of a semiconductor component according to one aspect of the present disclosure.

FIG. 13 is a block diagram illustrating a design workstation used for circuit, layout, and logic design of the multi-density metal-insulator-metal (MIM) capacitors disclosed above. A design workstation 1300 includes a hard disk 1301 containing operating system software, support files, and design software such as Cadence or OrCAD. The design workstation 1300 also includes a display 1302 to facilitate design of a circuit 1310 or the side-assembled passive devices 1312. A storage medium 1304 is provided for tangibly storing the design of the circuit 1310 or the side assembled passive devices 1312. The design of the circuit 1310 or the side assembled passive devices 1312 may be stored on the storage medium 1304 in a file format such as GDSII or GERBER. The storage medium 1304 may be a CD-ROM, DVD, hard disk, flash memory, or other appropriate device. Furthermore, the design workstation 1300 includes a drive apparatus 1303 for accepting input from or writing output to the storage medium 1304.

Data recorded on the storage medium 1304 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1304 facilitates the design of the circuit 1310 or the side assembled passive devices 1312 by decreasing the number of processes for designing semiconductor wafers.

Although specific circuitry has been set forth, it will be appreciated by those skilled in the art that not all of the disclosed circuitry is required to practice the disclosed embodiments. Moreover, certain well known circuits have not been described, to maintain focus on the disclosure.

The methodologies described herein may be implemented by various means depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine or computer readable medium tangibly embodying instructions may be used in implementing the methodologies described herein. For example, software code may be stored in a memory and executed by a processor. When executed by the processor, the executing software code generates the operational environment that implements the various methodologies and functionalities of the different aspects of the teachings presented herein. Memory may be implemented within the processor or external to the processor. As used herein, the term "memory" refers to any type of long term, short term, volatile, nonvolatile, or other memory and is not to be limited to any particular type of memory or number of memories, or type of media upon which memory is stored.

The machine or computer readable medium that stores the software code defining the methodologies and functions described herein includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. As used herein, disk and/or disc includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present teachings and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present teachings. Accordingly, the appended claims are intended to include within their scope such processes, machines, manufacture, compositions of matter, means, methods, or steps.

What is claimed is:

1. A device, comprising:
   a semiconductor substrate;
   a first intermediate conductive layer comprising a silicon nitride layer, the first intermediate conductive layer further comprising a first capacitor plate on a shallow trench isolation (STI) region in the semiconductor substrate and a first set of local conductive interconnects to source and drain regions of the device, the first capacitor plate partially formed in the silicon nitride layer;
   an insulator layer on a surface of the first capacitor plate facing away from the STI region;
   a second intermediate conductive layer, comprising a second capacitor plate on a surface of the insulator layer and arranged along an entire length of the surface of the insulator layer, and supported by the first plate of the capacitor;
   a first interconnect coupled to the first capacitor plate; and a second interconnect coupled to the second capacitor plate.

2. The device of claim 1, in which the first intermediate conductive layer comprises an active contact layer to active devices within an active region on the semiconductor substrate.

3. The device of claim 1, in which the second intermediate conductive layer comprises a stacked contact layer including a second set of local conductive interconnects stacked on the first set of local conductive interconnects to the source and drain regions on the semiconductor substrate.

4. The device of claim 1, in which a high-K insulator layer is disposed on the first plate instead of the insulator layer, the second MOL conductive layer being disposed on the high-K insulator layer instead of on the insulator layer.

5. The device of claim 1, in which the second intermediate conductive layer is arranged as a resistor.

6. The device of claim 1, integrated into a cell phone, a hand-held personal communication system (PCS) unit, a set top box, a music player, a video player, an entertainment unit, a navigation device, a portable data unit, and/or a fixed location data unit.

7. A device, comprising:
a semiconductor substrate;
a first intermediate conductive layer comprising a silicon nitride layer, the first intermediate conductive layer further comprising a means for storing a first electric charge on a shallow trench isolation (STI) region in the semiconductor substrate and a first set of local conductive interconnects to source and drain regions of the device, the first means for storing partially formed in the silicon nitride layer;
an insulator layer on a surface of the first electric charge storing means facing away from the STI region;
a second intermediate conductive layer, comprising a means for storing a second charge on a surface of the insulator layer and arranged along an entire length of the surface of the insulator layer, and supported by the first electric charge storing means;
a first interconnect coupled to the first electric charge storing means; and a second interconnect coupled to the second electric charge storing means.

8. The device of claim 7, in which the first intermediate conductive layer comprises an active contact layer on the semiconductor substrate.

9. The device of claim 7, in which the second intermediate conductive layer comprises a stacked contact layer on the semiconductor substrate.

10. The device of claim 7, in which a high-K insulator layer is disposed on the first plate instead of the insulator layer, the second intermediate conductive layer being disposed on the high-K insulator layer instead of on the insulator layer.

11. The method of claim 7, in which the second intermediate conductive layer is arranged as a resistor.

12. The device of claim 7, integrated into a cell phone, a hand-held personal communication system (PCS) unit, a set top box, a music player, a video player, an entertainment unit, a navigation device, a portable data unit, and/or a fixed location data unit.

* * * * *